(12) United States Patent
Chen et al.

(10) Patent No.: US 6,174,778 B1
(45) Date of Patent: Jan. 16, 2001

(54) METHOD OF FABRICATING METAL OXIDE SEMICONDUCTOR

(75) Inventors: Coming Chen, Taoyuan Hsien; Tony Lin, Kaohsiung Hsien; Jih-Wen Chou, Hsinchu, all of (TW)

(73) Assignee: United Microelectronics Corp., Hsinchu (TW)

( * ) Notice: Under 35 U.S.C. 154(b), the term of this patent shall be extended for 0 days.

(21) Appl. No.: 09/212,055

(22) Filed: Dec. 15, 1998

(51) Int. Cl.[7] .................................................. H01L 21/336
(52) U.S. Cl. ............................................ 438/302; 438/268
(58) Field of Search ...................................... 438/302, 268

(56) References Cited

U.S. PATENT DOCUMENTS

| | | | | |
|---|---|---|---|---|
| 5,344,790 | * | 9/1994 | Bryant | 438/302 |
| 5,593,907 | * | 1/1997 | Anjum | 438/302 |
| 5,753,556 | * | 5/1998 | Katada et al. | 438/302 |
| 5,893,740 | * | 4/1999 | Chang et al. | 438/289 |
| 5,933,733 | * | 8/1999 | Ferla et al. | 438/268 |
| 5,970,353 | * | 10/1999 | Sultan | 438/302 |
| 6,022,778 | * | 2/2000 | Contiero et al. | 438/268 |
| 6,057,191 | * | 5/2000 | Moroni | 438/257 |

OTHER PUBLICATIONS

S.Wolf Silicon Processing for The VSLI Era Lattice press v.3 p. 238–242,290,309–311, 621–622, 1995.*

* cited by examiner

*Primary Examiner*—Charles Bowers
*Assistant Examiner*—David S Blum
(74) *Attorney, Agent, or Firm*—Thomas, Kayden, Horstemeyer & Risley

(57) ABSTRACT

A method of fabricating a metal oxide semiconductor includes formation of a gate on a substrate. A source/drain extension is formed beside the gate in the substrate. An ion implantation step is performed to implant heavy impurities with a low diffusion coefficient in the substrate. A heavily doped halo region is formed in the substrate below the source/drain extension. A tilt-angled halo implantation step is performed to form a halo-implanted region in the substrate to the side of the source/drain extension below the gate.

19 Claims, 2 Drawing Sheets

METHOD OF FABRICATING METAL OXIDE SEMICONDUCTOR

BACKGROUND OF THE INVENTION

1. Field of the Invention

The present invention relates to a semiconductor fabricating method. More particularly, the present invention relates to a fabricating method of metal oxide semiconductor.

2. Description of the Related Art

As integrated circuits become more complicated and their function becomes more powerful, required density of transistors in an integrated circuit increases correspondingly. The high density of these complex integrated circuits cannot be easily achieved by simply decreasing a layout according to device proportions of the integrated circuits. The device size must be decreased by a design rule and with consideration for possible change in the physical characteristics of the device. For example, channel length of a metal oxide semiconductor (MOS) transistor cannot be educed infinitely. Reduction size may cause a short channel effect. Once the short channel effect happens, a punch through problem is likely to occur. The punch through problem occurs due to current leakage when the MOS transistor is switched off. The conventional solution to the punchthrough problem is to increase punchthrough voltage, in a procedure such as a punchthrough stopper implantation or a halo implantation.

FIG. 1 and FIG. 2 respectively explain the related positions of an anti-punchthrough region and a metal oxide semiconductor formed by a conventional method.

In FIG. 1, an N-type MOS field effect transistor (NMOSFET) is taken as an example. In a typical punch-through stopper implantation, p-type impurities are implanted in the substrate 100 before forming a gate 106 and a source/drain region 120. A heavily doped anti-punchthrough region 114 is formed in the substrate 100 below the surface-channel region 112 between the source/drain region 120.

In FIG. 2, a tilt-angle halo implantation step is performed after a gate 206 and a source/drain extension 210a are formed. P-type impurities are locally implanted in the substrate 200. An anti-punchthrough region 214, which is connected to the source/drain extension 210a, is formed in the substrate 300. In contrast with the anti-punchthrough region 114 formed by punchthrough stopper implantation, the anti-punchthrough region 214 formed by halo implantation, which region connects to the extension region 210a, has higher anti-punchthrough ability. Hence, the anti-punchthrough region 214 is more suitable than the anti-punchthrough region 114 for a MOS occupying a small planar area.

But difficulty is still encountered when trying to resolve the punchthrough problem. In the conventional MOS transistor as shown in FIG. 2, phosphorus (P) ions and arsenic (As) ions are often implanted in the substrate 200 to form the anti-punchthrough region 214. Light ions, such as P ions and As ions, with high diffusion coefficients, easily diffuse to the source/drain region 220 in the following thermal step. When the ions of anti-punchthrough region 214 diffuse to the source/drain region 220, the ion concentration of the anti-punchthrough region 214 is decreased, so the punchthrough problem is not effectively resolved. In order to increase the anti-punchthrough ability of the device, the punchthrough voltage must be increased. The conventional method for increasing the anti-punchthrough voltage of the device is to increase the concentration of the anti-punchthrough region 214. However, as the concentration of anti-punchthrough region 214 increases, the intensity of a body effect increases. In this manner, the voltage applied to the device must be increased in order to operate the device. In addition, as the concentration of the anti-punchthrough region 214 increases, the junction capacitance increases, which reduces the performance of the device.

SUMMARY OF THE INVENTION

One aspect of the invention is to provide an improved fabricating method for a metal oxide semiconductor, which is suitable for a highly integrated device.

Another aspect of the invention is to provide a fabricating method for a metal oxide semiconductor, which decreases the possibility of punchthrough problems arising from short channel effects.

To achieve these and other advantages and in accordance with the purpose of the invention, as embodied and broadly described herein, the invention provides a method of fabricating a metal oxide semiconductor. The invention includes formation of a gate on a substrate. A source/drain extension is formed beside the gate in the substrate. An ion implantation step is performed to implant heavy impurities with a low diffusion coefficient in the substrate. A heavily doped halo region is formed in the substrate below the source/drain extension. A tilt-angled halo implantation step is performed to form a halo-implanted region in the substrate to the side of the source/drain extension below the gate. A spacer is formed on a sidewall of the gate. A source/drain region is formed in the substrate beside the spacer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
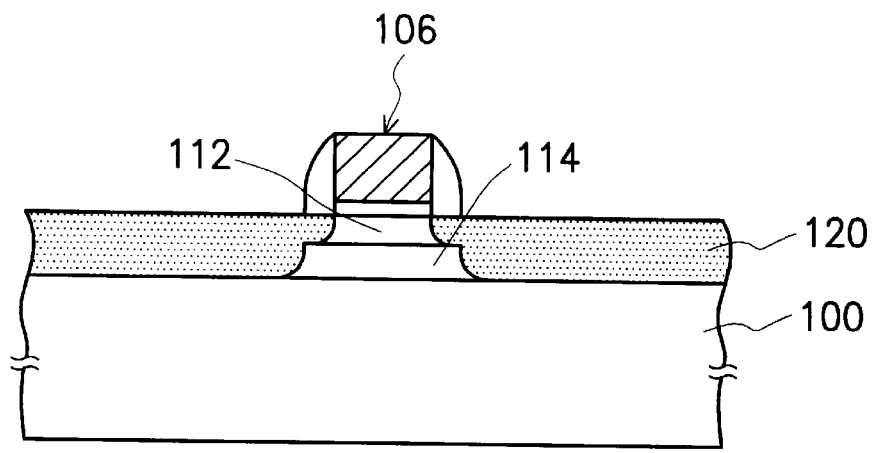
FIG. 1 is a schematic, cross-sectional view showing related positions of a conventional metal oxide semiconductor and an anti-punchthrough region.
Figure 2:
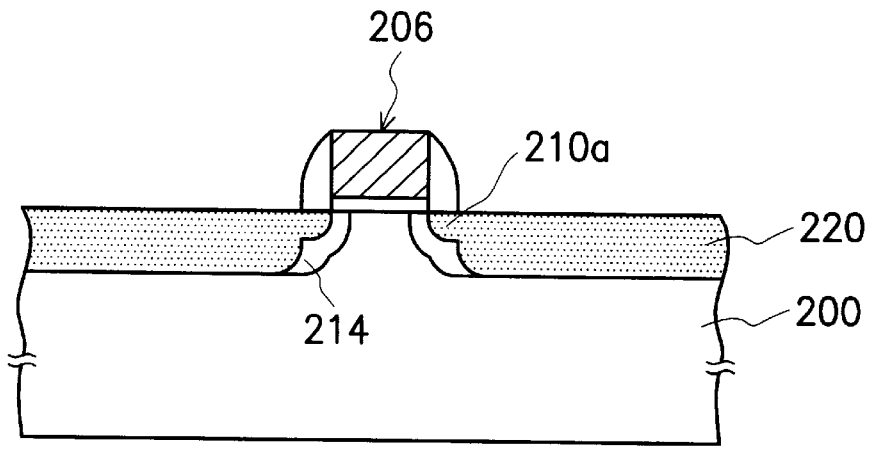
FIG. 2 is a schematic, cross-sectional view showing related positions of a conventional metal oxide semiconductor and another anti-punchthrough region.

Reference will now be made in detail to the present preferred embodiments of the invention, examples of which are illustrated in the accompanying drawings. Wherever possible, the same reference numbers are used in the drawings and the description to refer to the same or like parts.

FIGS. 3A through 3D are schematic, cross-sectional views showing a fabricating method of a metal oxide semiconductor according to one preferred embodiment of the invention.

Figure 3A:
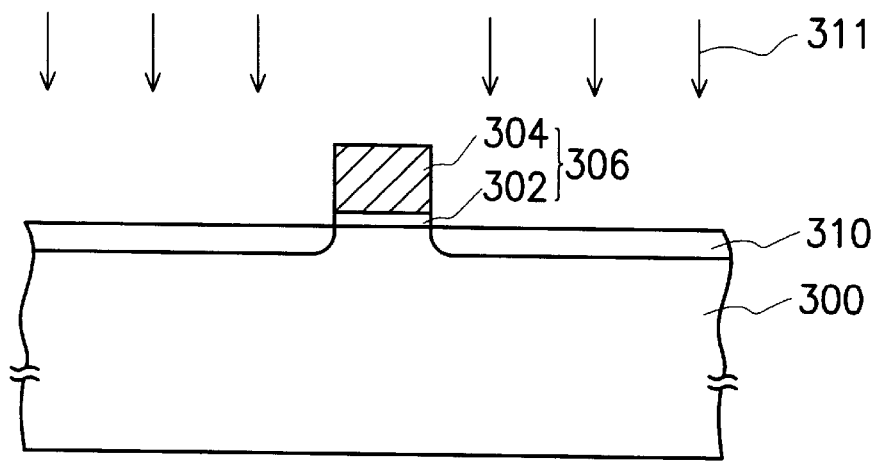
FIGS. 3A through 3D are schematic, cross-sectional views showing a fabricating method of a metal oxide semiconductor according to one preferred embodiment of the invention.

In FIG. 3A, a patterned gate oxide layer 302 and a gate conductive layer 304 are formed over a substrate 300 in order to form a gate 306 of a MOS transistor. The substrate 300 can be a p-type silicon substrate, an n-type silicon substrate, a p-well, or an n-well, for example. Typically, an oxide layer (not shown) having a preferred thickness of about 40 Å to 200 Å is formed on the substrate 300. A conductive layer (not shown) is formed on the oxide layer. The conductive layer can be a polysilicon layer formed by chemical vapor deposition, for example. The preferred thickness of the conductive layer is about 1500 Å to 2000 Å, for example. For example, conventional photolithographic and etching processes are performed to pattern the conductive layer and the oxide layer, which forms the gate oxide layer 302 and the gate conductive layer 304 as shown in FIG. 3A.

A source/drain extension 310 is formed in the substrate 300 beside the gate 306. Typically, the gate 306 is used as a mask while an ion implantation step 311 is performed. Ion impurities are implanted in the substrate 300 in the ion implantation step 311. The source/drain extension 310 preferably has a concentration of about $1 \times 10^{19}$ ions/cm$^3$ to $4 \times 10^{19}$ ions/cm$^3$. When forming a NMOS, the impurities, such as B ions, $BF_2^+$ ions, or other suitable n-type impurities, are implanted to form a n-type, source/drain extension. When forming a PMOS, the impurities, such as P ions, As ions, or other suitable p-type impurities, are implanted to form a p-type, source/drain extension.

Figure 3B:
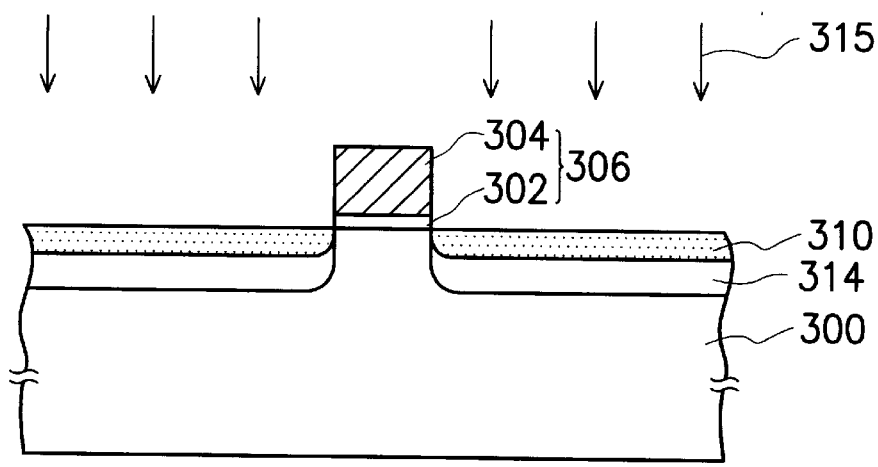

As shown in FIG. 3B, the preferred embodiment of the invention provides a heavily doped halo region 314 in the substrate 300 below the source/drain extension region 310. The heavily doped halo region 314 is used as anti-punchthrough layer. The heavily doped halo region 314 can be formed by the following exemplary steps. Preferably, the gate 306 is used as a mask when an ion implantation step 315 is performed to implant impurities in the substrate 300. The impurities implanted in the ion implantation step 315 preferably are heavy ions with a low diffusion coefficient, although other suitable ions may be used. In this manner, the diffusion of the impurities in the following thermal step can be decreased and the concentration of the heavily doped halo region 314 can be maintained. In contrast with the conventional method, which uses light impurities with a high diffusion coefficient, the method of the invention uses heavy impurities with a low diffusion coefficient. The concentration of the heavily doped halo region 314 thus can be maintained. Hence, the punchthrough problem is resolved. When forming a NMOS, indium (In) ions, whose diffusion coefficient is 5 to 10 times lower than that of boron (B) ions, are preferably implanted to the substrate 300, which form the heavily doped halo region 314 with a concentration of about $1 \times 10^{18}$ ions/cm$^3$ to $4 \times 10^{18}$ ions/cm$^3$. When forming a PMOS, antimony (Sb) ions are implanted in the substrate 300, which form the heavily doped halo region 314 with a concentration of about $1 \times 10^{18}$ ions/cm$^3$ to $4 \times 10^{18}$ ions/cm$^3$.

Figure 3C:
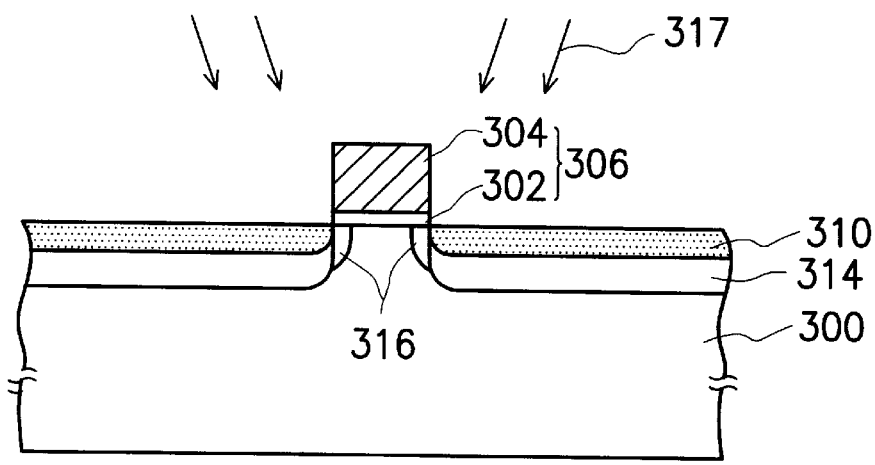

In FIG. 3C, a tilt-angled halo implantation step 317 is performed to implant impurities in the substrate 300. A halo-implanted region 316 is formed in the substrate 300 to the side of the source/drain extension 310 below the gate 306. The halo-implanted region 316 is formed in order to decrease the occurrence of the short channel effect. Preferably, the gate 310 is used as a mask when the tilt-angled halo step 317 is performed. The halo-implanted region 316 preferably has a concentration of about $1 \times 10^{17}$ atims/cm$^3$ to $4 \times 10^{17}$ ions/cm$^3$. When forming an NMOS, the impurities, such as B ions, $BF_2^+$ ions, or other suitable n-type impurities, are implanted to form an n-type, halo-implanted region. When forming a PMOS, the impurities, such as P ions, As ions, or other suitable P-type impurities, are implanted to form a P-type, halo-implanted region.

Figure 3D:
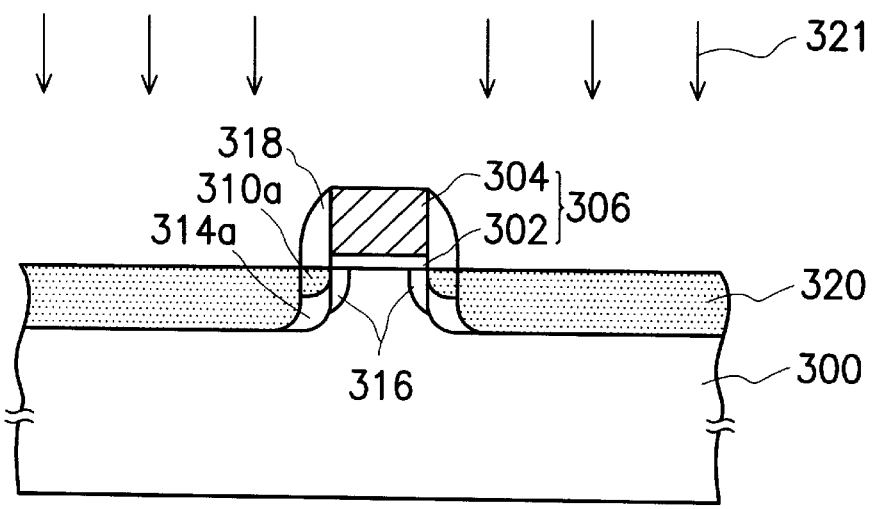

In FIG. 3D, a spacer 318 is formed on a sidewall of the gate 306. The material of the spacer 318 includes isolation materials, such as silicon oxide or silicon nitride, for example. The spacer 318 can be formed by the following exemplary steps. An isolation layer (not shown) is formed over the substrate 300 by chemical vapor deposition. An etching back step is performed. The isolation layer is removed to form the spacer 318 on the sidewall of the gate 316.

Typically, the gate 306 and the spacer 318 are used as masks when an ion implantation step 321 is performed. A source/drain region 320 is formed in the substrate 300 beside the spacer 318. The dose of impurities must be sufficient to replenish the concentration of the heavily doped halo region 314 to form the source/drain region 320. The source/drain region 320 includes the heavily doped halo region 314 and a portion of the source/drain extension 310a. The source/drain region 320 is to the side of the source/drain extension 310a, which is below the spacer 318 in the substrate 300. The source/drain region 320 preferably has a concentration of about $1 \times 10^{19}$ ions/cm$^3$ to $1 \times 10^{20}$ ions/cm$^3$. When forming a NMOS, the impurities, such as B ions, $BF_2^+$ ions, or other suitable n-type impurities, are implanted in the ion implantation step 321 to form an n-type source/drain region. When forming a PMOS, the impurities, such as P ions, As ions, or other suitable p-type impurities, are implanted the ion implantation step 321 to form a p-type source/drain region. It is known that the source/drain extension 310 and the source/drain region 320 are n-type in the NMOS. The source/drain extension 310 and the source/drain region 320 are p-type in a PMOS.

The heavily doped halo region 314a connected to the source/drain region 320 below the source/drain extension 310a is composed of impurities such as heavy impurities or impurities with low diffusion coefficient. Thus, in the following thermal step, the diffusion of the heavily doped halo region 314a is decreased. In contrast with the conventional method, which uses light impurities with a high diffusion coefficient, the method of the invention uses heavy impurities with a low diffusion coefficient. Therefore, the concentration of the anti-punchthrough layer can be maintained and the punchthrough problem of the device can be resolved.

In the preferred embodiment described above, first the source/drain extension 310 is formed in the substrate 300, and then the heavily halo-implanted region 314 and the halo-implanted region 316 are formed in sequence. However, the step order of forming the source/drain extension region 310, the heavily halo-implanted region 314, and the halo-implanted region 316 is not limited to the order described as the preferred embodiment. The step order can be properly changed in order to meet the requirement of the fabricating process.

In summary, the invention has the following advantages:

1. The invention forms a heavily doped halo region connected to the source/drain region below the source/drain extension region. The heavily doped halo region is formed by impurities, such as heavy impurities with low diffusion coefficient. Thus, the ion diffusion of the heavily doped halo region is decreased in the following step. The concentration of the anti-punchthrough layer can be maintained and thus the punchthrough problem of the device is resolved.

2. In the invention, the concentration of the anti-punchthrough region does not need to be increased. The occurrence of the body effect is reduced and the junction capacitance is not overly increased. Thus, device performance can be further increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a metal oxide semiconductor (MOS), comprising the steps of:
    forming a gate on a substrate;
    forming a source/drain extension beside the gate in the substrate;
    forming a heavily doped halo region in the substrate below the source/drain extension by an implantation of heavy impurities with a low diffusion coefficient;
    forming a spacer on a sidewall of the gate; and forming a source/drain region in the substrate beside the spacer.

2. The method of claim 1, wherein concentration of the source/drain extension is about $1 \times 10^{19}$ ions/cm$^3$ to $4 \times 10^{19}$ ions/cm$^3$.

3. The method of claim 1, which further comprises performing a first ion implantation step to implant impurities to form the source/drain extension.

4. The method of claim 3, wherein the source/drain extension and the source/drain region are n-type and the impurities comprise boron ions.

5. The method of claim 3, wherein the source/drain extension and the source/drain region are n-type and the impurities comprise BF$_2$ ions.

6. The method of claim 3, wherein the source/drain extension and the source/drain region are p-type and the impurities comprise phosphorus ions.

7. The method of claim 3, wherein the source/drain extension and the source/drain region are p-type and the impurities comprise arsenic ions.

8. The method of claim 1, wherein concentration of the heavily doped halo region is about $1 \times 10^{18}$ ions/cm$^3$ to $4 \times 10^{18}$ ions/cm$^3$.

9. The method of claim 1, wherein the source/drain extension and the source/drain region are n-type and the heavy impurities with a low diffusion coefficient comprise indium ions.

10. The method of claim 1, wherein the source/drain extension and the source/drain region are p-type and the heavy impurities with a low diffusion coefficient comprise antimony ions.

11. The method of claim 1, further comprising performing a tilt-angled halo implantation step to form a halo-implanted region in the substrate to the side of the source/drain extension below the gate.

12. The method of claim 11, wherein concentration of the halo-implanted region has a concentration of about $1 \times 10^{17}$ ions/cm$^3$ to $4 \times 10^{17}$ ions/cm$^3$.

13. The method of claim 1, which further comprises performing a third ion implantation step to form the source/drain region.

14. The method of claim 1, wherein concentration of the source/drain region is about $1 \times 10^{19}$ ions/cm$^3$ to $1 \times 10^{20}$ ions/cm$^3$.

15. A method of fabricating a metal oxide semiconductor (MOS), comprising the steps of:
    forming a gate on a substrate;
    forming a source/drain extension beside the gate in the substrate; and
    performing an ion implantation step to implant heavy impurities with a low diffusion coefficient in order to form a heavily doped halo region in the substrate below the source/drain extension.

16. The method of claim 15, wherein the source/drain extension is n-type and the heavy impurities with a low diffusion coefficient comprise indium ions.

17. The method claim 15, wherein concentration of the heavily doped halo region is about $1 \times 10^{18}$ ions/cm$^3$ to $4 \times 10^{18}$ ions/cm$^3$.

18. The method of claim 15, wherein the source/drain extension is p-type and the heavy impurities with a low diffusion coefficient comprise antimony ions.

19. The method of claim 15, further comprising forming a halo-implanted region in the substrate to the side of the source/drain extension below the gate.

* * * * *